(12) United States Patent
Mikuriya et al.

(10) Patent No.: US 11,772,231 B2
(45) Date of Patent: Oct. 3, 2023

(54) DOUBLE-SIDED WAFER POLISHING METHOD

(71) Applicant: SUMCO CORPORATION, Tokyo (JP)

(72) Inventors: Shunsuke Mikuriya, Tokyo (JP); Tomonori Miura, Tokyo (JP)

(73) Assignee: SUMCO CORPORATION, Tokyo (JP)

( * ) Notice: Subject to any disclaimer, the term of this patent is extended or adjusted under 35 U.S.C. 154(b) by 1288 days.

(21) Appl. No.: 16/320,841

(22) PCT Filed: May 23, 2017

(86) PCT No.: PCT/JP2017/019129
§ 371 (c)(1),
(2) Date: Jan. 25, 2019

(87) PCT Pub. No.: WO2018/020798
PCT Pub. Date: Feb. 1, 2018

(65) Prior Publication Data
US 2019/0160627 A1    May 30, 2019

(30) Foreign Application Priority Data
Jul. 29, 2016   (JP) ................................. 2016-150449

(51) Int. Cl.
*B24B 37/28*   (2012.01)
*H01L 21/304*  (2006.01)
(Continued)

(52) U.S. Cl.
CPC ............ *B24B 37/28* (2013.01); *B24B 37/042* (2013.01); *B24B 49/00* (2013.01); *H01L 21/304* (2013.01)

(58) Field of Classification Search
CPC ....... B24B 37/08; B24B 37/04; B24B 37/042; B24B 37/12; B24B 37/16; B24B 37/28
See application file for complete search history.

(56) References Cited

U.S. PATENT DOCUMENTS 9,403,257 B2    8/2016  Miura et al.
2009/0305615 A1  12/2009  Uchiyama
(Continued)

FOREIGN PATENT DOCUMENTS

| JP | 2003-019660 A | 1/2003 |
| JP | 2008-023617 A | 2/2008 |

(Continued)

OTHER PUBLICATIONS

U.S. Appl. No. 16/341,692 to Mami Kubota et al., which was filed Apr. 12, 2019.
(Continued)

*Primary Examiner* — Joel D Crandall
(74) *Attorney, Agent, or Firm* — Greenblum & Bernstein, P.L.C.

(57) ABSTRACT

Provided is a double-sided polishing method of a wafer in which the wafer, which has been set in a wafer loading hole of the carrier, is compressed and held along with the carrier with an upper platen and a lower platen and the upper platen and the lower platen are rotated while supplying slurry to the wafer. The method includes: previously measuring an inclination value of a main surface of each of a plurality of carriers in the vicinity of the edge of the wafer loading hole; selecting, from among the plurality of carriers, those for which the inclination value is equal to or smaller than a threshold based on the measurement results of the inclination value; and applying the double-sided polishing to a wafer using the selected carrier.

7 Claims, 10 Drawing Sheets

(51) Int. Cl.
   *B24B 37/04*    (2012.01)
   *B24B 49/00*    (2012.01)

(56) References Cited

U.S. PATENT DOCUMENTS

| | | |
|---|---|---|
| 2015/0217425 A1 | 8/2015 | Sasaki et al. |
| 2015/0375363 A1 | 12/2015 | Sato et al. |

FOREIGN PATENT DOCUMENTS

| | | | |
|---|---|---|---|
| JP | 2010-179375 A | 8/2010 | |
| JP | 2014-050913 A | 3/2014 | |
| JP | 2014-188668 A | 10/2014 | |
| JP | 2015-104771 A | 6/2015 | |
| JP | 6128198 B1 | 5/2017 | |
| TW | 201446416 A | 12/2014 | |

OTHER PUBLICATIONS

International Search Report issued in International Bureau of WIPO Patent Application No. PCT/JP2017/019129, dated Aug. 15, 2017.

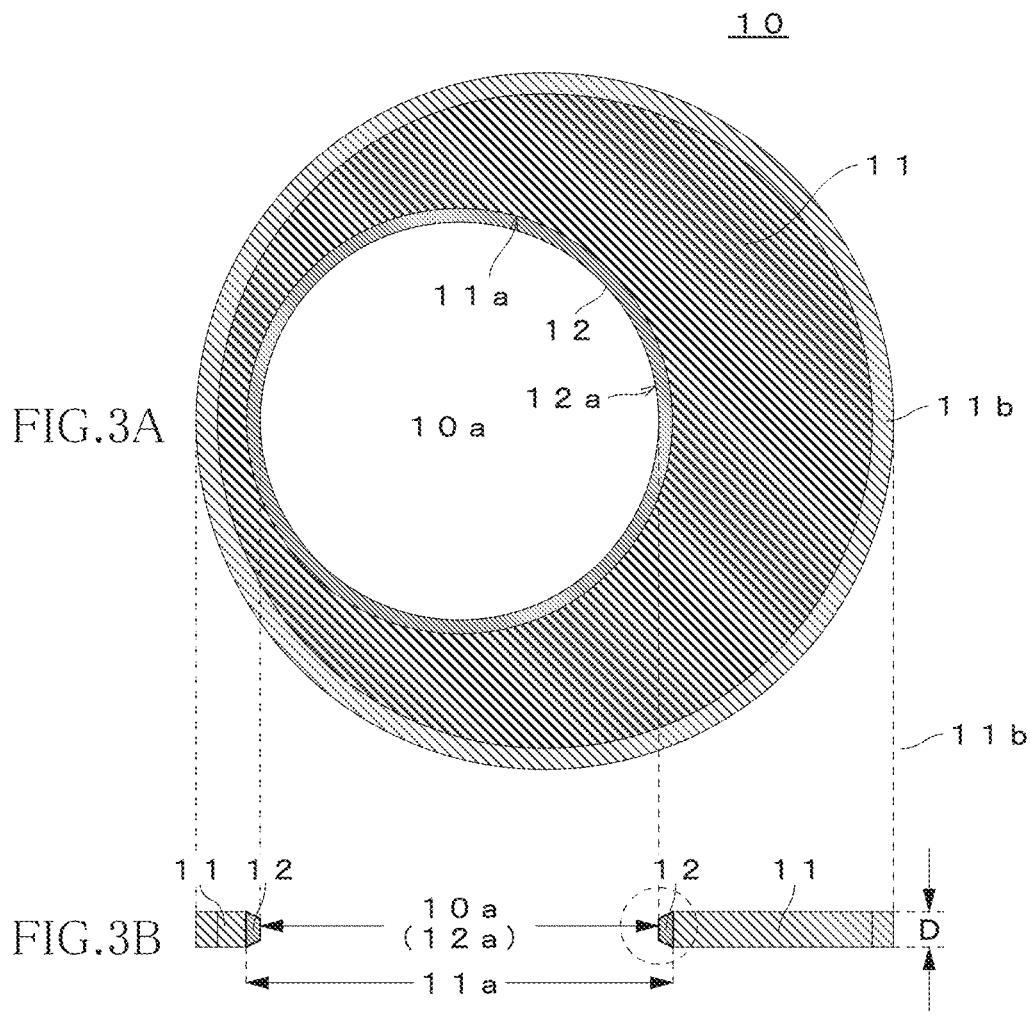
FIG.3A
FIG.3B
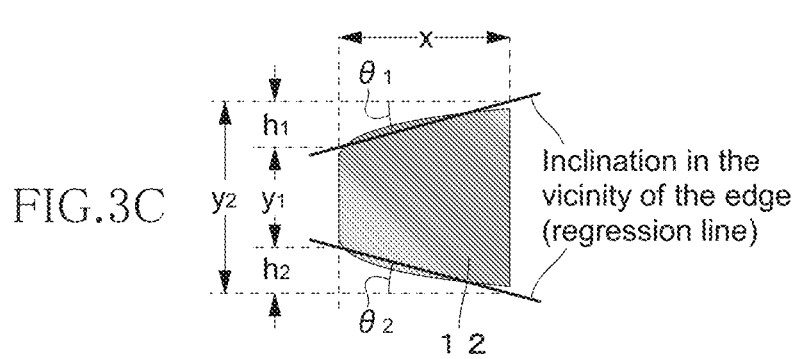
FIG.3C

| Thickness around the Carrier Hole | Wafer thickness | Gap (Wafer-Carrier) | Inclination value of the Carrier Hole | | | Inclination value of the Carrier Hole | | |
|---|---|---|---|---|---|---|---|---|
| | | | 0.100 | 0.250 | 0.300 | 0.100 | 0.250 | 0.300 |
| (um) | (um) | (um) | ESFQD mean (nm) | | | ESFQR max (nm) | | |
| 778 | 782 | 4 | 1.12 | -5.21 | -13.3 | 9.5 | 24.2 | 53.5 |
| 778 | 781.6 | 3.6 | 1.95 | -5.09 | -10.33 | 10.1 | 23.9 | 51.6 |
| 778 | 781.2 | 3.2 | 2.12 | -4.74 | -10.18 | 10.5 | 23.2 | 49.9 |
| 778 | 780.8 | 2.8 | 2.89 | -4.33 | -10.02 | 10.7 | 23.1 | 47.2 |
| 778 | 780.4 | 2.4 | 3.01 | -3.61 | -9.51 | 11.2 | 22.8 | 44.1 |
| 778 | 780 | 2 | 3.11 | -3.52 | -9.12 | 11.4 | 22.7 | 39.1 |
| 778 | 779.6 | 1.6 | 3.14 | -3.22 | -9.1 | 12.8 | 20.9 | 38.2 |
| 778 | 779.2 | 1.2 | 3.24 | -3.02 | -9.03 | 13.1 | 19.9 | 38.3 |
| 778 | 778.8 | 0.8 | 3.29 | -2.97 | -8.99 | 13.6 | 19.5 | 37.2 |
| 778 | 778.4 | 0.4 | 3.33 | -2.72 | -8.61 | 14.9 | 18.6 | 35.1 |
| 778 | 778 | 0 | 3.48 | -2.66 | -8.5 | 16.5 | 17.2 | 33.6 |

FIG. 9

DOUBLE-SIDED WAFER POLISHING METHOD

TECHNICAL FIELD

The present invention relates to a double-sided wafer polishing method and, more particularly, to a double-sided polishing method of a wafer using double-sided polishing carrier having a specific shape.

BACKGROUND ART

A silicon wafer used as a substrate material for semiconductor devices is manufactured by sequentially applying processes such as outer periphery grinding, slicing, lapping, etching, double-sided polishing, single-sided polishing, cleaning, etc., to a silicon single crystal ingot grown by Czochralski method. Among the above processes, the double-sided polishing is a process required in order to obtain a wafer having a predetermined thickness and to improve the flatness of the wafer, in which a double-sided polishing apparatus for polishing both side of the wafer at the same time is used.

As a technique relating to the double-sided polishing process, for example, Patent Document 1 describes that double sides of the wafer are polished while maintaining the flatness of an inner peripheral surface of a resin inserter of a carrier holding the wafer at 100 µm or less and the verticality of the inner peripheral surface thereof at 5° or less so as to suppress degradation in the flatness of the wafer after the polishing such as outer peripheral sagging (edge roll-off). Further, Patent Document 2 describes that a carrier made of titanium is used for a double-sided polishing apparatus and its surface roughness Ra is set to 0.14 µm or more so as to reduce an outer peripheral sagging of the wafer after the double-sided polishing to improve the flatness.

Further, Patent Document 3 describes a double-sided polishing method including housing a frame body having a thickness larger than that of a wafer (object to be processed) in the opening of a carrier plate of a double-sided polishing apparatus and polishing the wafer housed in the frame body. That is, when performing the double-sided polishing of the wafer housed in the opening of the carrier plate held between upper and lower platens integrally driven into rotation through a polishing cloth, the wafer is housed in the frame body having a thickness larger than that thereof and mounted together with the frame body in the opening of the carrier plate.

CITATION LIST

Patent Document

[Patent Document 1] Japanese Patent Application Laid-Open No. 2014-50913
[Patent Document 2] Japanese Patent Application Laid-Open No. 2008-23617
[Patent Document 3] Japanese Patent Application Laid-Open No. 2003-19660

SUMMARY OF THE INVENTION

Problem to be Solved by the Invention

In a double-sided polishing apparatus, one or more wafers are mounted in each of a plurality of carriers for the double-sided polishing; however, the outer periphery of the wafer is significantly deformed under the influence of a thickness profile of the carrier. Thus, conventionally, for suppressing a variation in the outer peripheral shape among the wafers, the thickness of each of the carriers is measured, followed by sorting of the carriers by the thickness to minimize a variation in the thickness among one set of the carriers mounted in the double-sided polishing apparatus at a time and, in this state, the double-sided polishing is performed.

However, even when the double-sided polishing is performed using the one set of carriers among which the thickness variation is suppressed by the sorting of the carriers by the thickness, the outer peripheral shape varies from one wafer to another, and one or some wafers inferior in flatness will still unavoidably exist. Thus, improvements relating thereto are desired.

The object of the present invention is to provide a double-sided polishing method of a wafer capable of reducing a variation in the flatness by suppressing the edge roll-off of the wafer.

Means for Solving the Problem

To solve the above problem, a double-sided polishing method of a wafer according to the present invention is provided in which the wafer, which has been set in a wafer loading hole of a carrier, is compressed and held along with the carrier with an upper platen and a lower platen and the upper platen and the lower platen are rotated while supplying slurry to the wafer, the method including the steps of: previously measuring an inclination value of a main surface of each of a plurality of carriers in the vicinity of the edge of the wafer loading hole; selecting, from among the plurality of carriers, those for which the inclination value is equal to or smaller than a threshold based on the measurement results of the inclination value; and applying the double-sided polishing to the wafer using the selected carrier.

According to the present invention, the inclination value within a certain range extending outward from the inner peripheral edge of the wafer loading hole is calculated, and the inclination value of a carrier to be used actually in the double-sided polishing process is limited to a range equal to or smaller than the threshold, whereby edge roll-off of the wafer after the polishing can be suppressed, so that the wafer can be improved in terms of outer peripheral shape distribution.

In the present invention, the threshold is preferably set to $0.25 \times 10^{-3}$, and more preferably, to $0.2 \times 10^{-3}$. When the inclination value within the certain range from the inner peripheral edge of the wafer loading hole is equal to or smaller than $0.25 \times 10^{-3}$, the edge roll-off of the wafer can reliably be suppressed. Further, by using a carrier whose inclination value is equal to or smaller than $0.2 \times 10^{-3}$, it is possible to manufacture a wafer more excellent in outer peripheral flatness, in which ESFQRmax thereof is equal to or smaller than 25 nm.

In the present invention, the measurement range of the inclination value is preferably set in a range between the inner peripheral edge of the carrier and a 2 mm inward position therefrom. The inclined shape of the main surface in the range between the inner peripheral edge of the carrier and a 2 mm inward position therefrom has significant influence on the wafer outer peripheral shape, so that by managing the inclined shape of the carrier in this range, the flatness of the wafer outer peripheral portion can be sufficiently improved.

In the present invention, the inclination value of the main surface of the carrier in the vicinity of the edge of the wafer loading hole is preferably the inclination value at one position of the inner peripheral edge of the wafer loading hole or mean value of the inclination values at a plurality of positions of the inner peripheral edge of the wafer loading hole and, more preferably, the mean value of the inclination values at a plurality of positions set at equal intervals along the inner peripheral edge of the wafer loading hole. By thus measuring the inclination value at a plurality of positions, reliability of the inclination value can be enhanced.

In the present invention, the inclination value of the main surface of the carrier in the vicinity of the edge of the wafer loading hole is preferably an inclination of a regression line derived from the thickness distribution of the carrier within a certain range from the inner peripheral edge. The edge roll-off of the wafer loading hole of the carrier is formed at both upper and lower main surfaces of the carrier, so that by calculating the carrier inclination value as a change rate of the thickness in the vicinity of the edge of the carrier, the inclination values of both front and back surfaces of the carrier can be taken into consideration, and the carrier inclination value can be easily calculated. Further, by limiting the inclination value of the carrier to a range equal to or smaller than a threshold, the edge roll-off of the wafer after the polishing can be suppressed, so that the wafer can be improved in terms of outer peripheral shape distribution.

In the present invention, the carrier is preferably mainly made of metal such as stainless steel or resin such as glass epoxy resin. Further, preferably, the carrier is constituted of a combination of a metal carrier body having a circular opening and a ring-shaped resin inserter provided along the inner periphery of the opening of the carrier body, and the width of the resin inserter is equal to or larger than 2 mm.

A double-sided polishing method of the wafer according to the present invention is a method that uses a plurality of carriers to apply double-sided polishing to a plurality of wafers at a time, wherein the respective inclination values of the main surfaces of the plurality of respective carriers in the vicinity of the edge of a wafer loading hole are all preferably equal to or smaller than a threshold, and a variation in thickness among the plurality of carriers preferably falls within ±4 μm. When all the plurality of carriers used in one batch process satisfy the above conditions, the flatness of the outer peripheral portions of the individual wafers can be sufficiently improved.

Further, a double-sided polishing method of a wafer according to the present invention is a method that clamps, together with a carrier, a wafer set in a wafer loading hole of the carrier between upper and lower platens and applies double-sided polishing to the wafer by rotating the upper and lower platens while supplying slurry to the wafer, wherein only a carrier whose inclination value within a certain range from the inner peripheral edge of the wafer loading hole is equal to or smaller than $0.25 \times 10^{-3}$ is used as the carrier.

According to the present invention, the inclination value within a certain range extending outward from the inner peripheral edge of the wafer loading hole is calculated, and the inclination value of a carrier to be used actually in the double-sided polishing process is limited to a range equal to or smaller than $0.25 \times 10^{-3}$, whereby edge roll-off of the wafer after the polishing can be suppressed, so that the wafer can be improved in terms of outer peripheral shape distribution.

Advantageous Effects of the Invention

According to the present invention, there can be provided a double-sided polishing method of a wafer capable of reducing a variation in flatness by suppressing the edge roll-off of the wafer.

BRIEF DESCRIPTION OF DRAWINGS

FIGS. 3A to 3C are views illustrating the configuration of the carrier, wherein FIG. 3A is a plan view, FIG. 3B is a cross-sectional side view, and FIG. 3C is a partially enlarged view showing the vicinity of the inner peripheral edge (resin inserter) of the wafer loading hole of the carrier.

FIGS. 5A and 5B are schematic diagrams for explaining the relationship between the inclined shape of the main surface of the carrier 10 in the vicinity of the edge of the wafer loading hole 10a and the edge shape of the wafer after the polishing, wherein FIG. 5A illustrates the inclined surface according to a conventional technique, and FIG. 5B illustrates the inclined surface according to the present invention.

FIGS. 6A and 6B are views for explaining a method of measuring the carrier inclination value, wherein FIG. 6A is a plan view for explaining line scan measurement positions of the carrier, and FIG. 6B is a cross-sectional side view for explaining the image of a carrier to be measured and an inclination calculation position of the carrier.

FIG. 9 is a table showing the relationship between the Gap and ESFQDmean and ESFQRmax of the wafer after polishing for each inclination value of the carrier in the vicinity of the edge of the wafer loading hole (carrier hole).

DETAILED DESCRIPTION OF THE EMBODIMENTS

Preferred embodiments of the present invention will be described in detail below with reference to the accompanying drawings.

Figure 1:
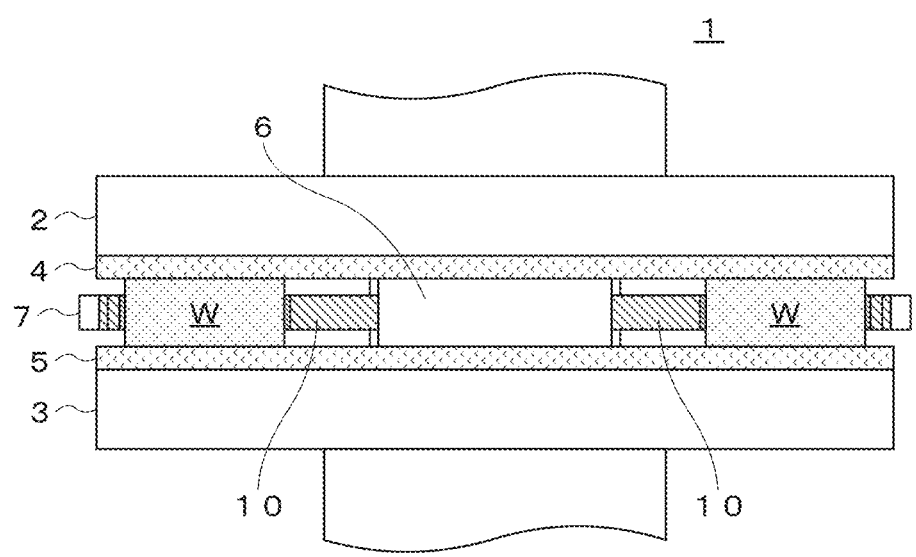
FIG. 1 is a schematic cross-sectional side view illustrating a configuration of a double-sided polishing apparatus according to an embodiment of the present invention.
Figure 2:
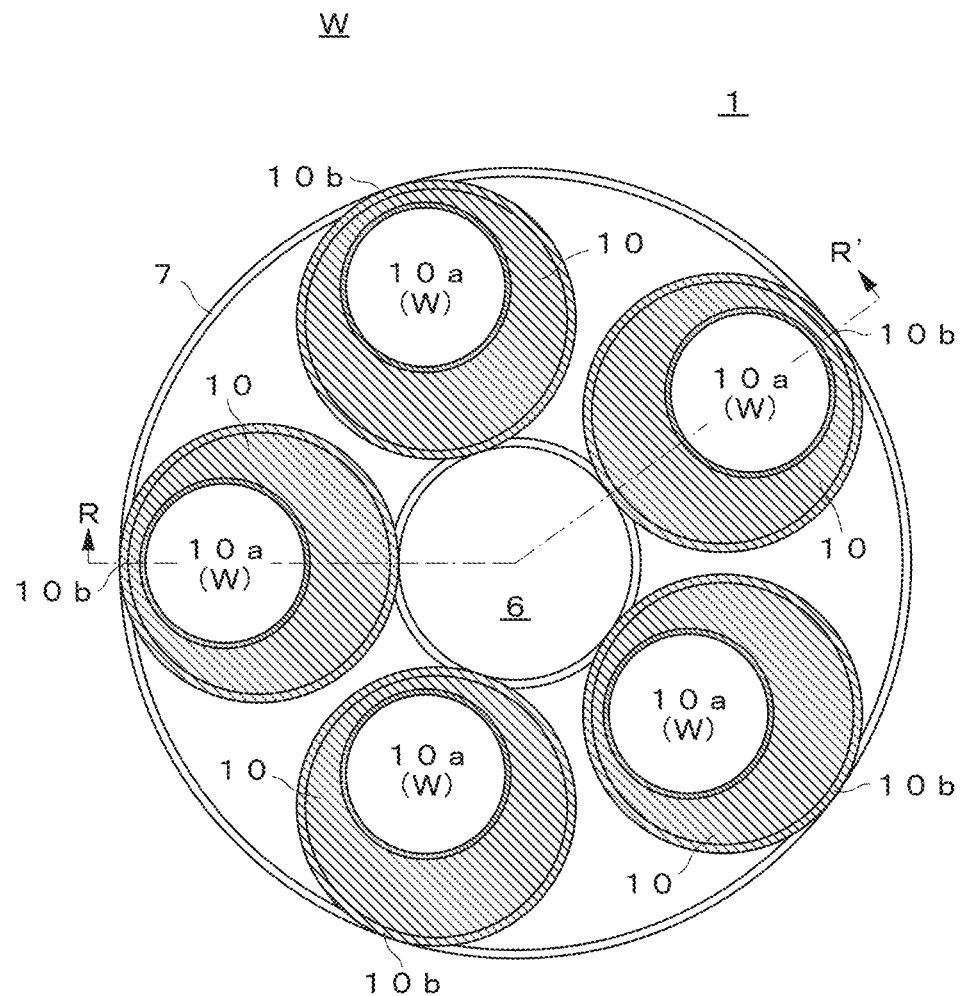
FIG. 2 is a plan view of the double-sided polishing apparatus illustrated in FIG. 1.

FIG. 1 is a schematic cross-sectional side view illustrating a configuration of a double-sided polishing apparatus according to an embodiment of the present invention. FIG. 2 is a plan view of the double-sided polishing apparatus illustrated in FIG. 1, wherein FIG. 1 is a cross-sectional view taken along line R-R' of FIG. 2.

As illustrated in FIGS. 1 and 2, a double-sided polishing apparatus 1 includes an upper platen 2 and a lower platen 3 provided so as to oppose each other in the vertical direction, and polishing cloths 4 and 5 are affixed to the lower surface of the upper platen 2 and the upper surface of the lower platen 3, respectively. A sun gear 6 is provided at the center portion thereof between the upper platen 2 and the lower platen 3, and an internal gear 7 is provided at the peripheral portion thereof. Each wafer W is, e.g., a silicon wafer and sandwiched between the upper platen 2 and the lower platen 3 in a state of being set in a wafer loading hole 10a of a carrier 10.

As illustrated in FIG. 2, five carriers 10 are provided around the sun gear 6, and the outer peripheral teeth 10b of each carrier 10 are engaged with the respective teeth of the sun gear 6 and the internal gear 7. The upper platen 2 and the lower platen 3 are rotationally driven by a not-shown driving source and, whereby each carrier 10 revolves around the sun gear 6 while rotating. At this time, the wafers W set in the wafer loading holes 10a of the carriers 10 are held by the carriers 10, and both surfaces thereof are simultaneously polished by contact with the upper and lower polishing cloths 4 and 5. During polishing, polishing liquid is supplied from a not-shown nozzle. For example, alkali solution in which colloidal silica is dispersed can be used as the polishing liquid.

FIGS. 3A to 3C are views illustrating the configuration of the carrier 10, wherein FIG. 3A is a plan view, FIG. 3B is a cross-sectional side view, and FIG. 3C is a partially enlarged view showing the vicinity of the inner peripheral edge (resin inserter 12) of the wafer loading hole 10a of the carrier 10.

As illustrated in FIGS. 3A and 3B, the carrier 10 includes a metal carrier body 11 made of metal and having a circular opening 11a that is larger than the wafer W, and a resin inserter 12 having ring-shape and disposed along the inner peripheral edge of the opening 11a of the carrier body 11.

The carrier body 11 is a disk-like member, and the outer peripheral teeth 11b are provided at the outer peripheral portion thereof. Although a typical material of the carrier body 11 is SUS, titanium or other metal material may be used. A thickness D of the carrier body 10 is set based on a target thickness of the wafer W after the double-sided polishing. For example, the thickness of the carrier 10 used for a wafer having a diameter of 300 mm is set to about 0.8 mm, and sizing/polishing is performed to reduce the thickness of the wafer W having a thickness of about 1 mm before processing to a thickness equivalent to that of the carrier 10. Since the center position of the opening 11a is offset from the center position of the carrier body 11, the wafer W set in the opening 11a is eccentrically moved with the center of the carrier body 11 as the rotation axis, whereby polishing efficiency and polishing uniformity are enhanced.

The resin inserter 12 is interposed between the outer peripheral surface of the wafer W and the inner peripheral surface of the opening 11a of the carrier body 11 and serves as preventing contact therebetween. An inner opening 12a of the resin inserter 12 constitutes the wafer loading hole 10a (see FIG. 2) of the carrier 10, and the outer peripheral surface of the wafer W is in contact with the inner peripheral surface of the resin inserter 12. The lateral width (ring width) of the resin inserter 12 is, for example, 2 mm or larger and is determined in consideration of the size of the opening 11a of the carrier body 11 and the size of the wafer W. The thickness of the resin inserter 12 is preferably the same as the thickness D of the carrier body 11.

As illustrated in FIG. 3C, both the upper and lower corners of the inner peripheral portion of the inner opening 12a of the resin inserter 12 are not right-angled and have a roll-off shape. When the wafer W having a thickness of about 1 mm before processing is polished to a thickness equivalent to that of the carrier 10 as described above, the carrier 10 is also polished together with the wafer W, so that a roll-off inevitably occurs in the inner peripheral edge of the resin inserter 12 made of a soft material.

In the present embodiment, an inclination value of the main surface of the carrier 10 in the vicinity of the edge of the wafer loading hole 10a (hereinafter, referred to merely as "carrier inclination value") refers to the inclination value of an upward slope extending from the inner peripheral edge of the resin inserter 12 toward the outer periphery thereof. The edge roll-off is formed in the upper and lower main surfaces of the resin inserter 12, so that the carrier inclination value is calculated first by calculating a thickness distribution of the resin inserter 12 from the inner peripheral edge toward the outer periphery and then by calculating the inclination of a regression line derived from the thickness distribution within a certain range from the inner peripheral edge. That is, the carrier inclination value can be calculated as a change rate of the thickness in the vicinity of the edge of the carrier.

Assuming that the thickness of the inner peripheral edge of the resin inserter 12 calculated from the regression line derived from the thickness distribution of the resin inserter 12 is $y_1$ and that the thickness of the outer peripheral side of the resin inserter 12 at a position separated from the inner peripheral edge by a distance x is $y_2$, an inclination value tan $\theta$ of the carrier is $(y_2-y_1)/x$. That is, the inclination value tan $\theta$ of the carrier is calculated as a sum of a front side inclination value tan $\theta_1=h_1/x$ and a back side inclination value tan $\theta_2=h_2/x$. The angle $\theta$ is a sum of $\theta_1$ and $\theta_2$, and normally, $\theta_1$ is approximately equal to $\theta_2$.

To improve the outer peripheral shape of the wafer W after the double-sided polishing, the inclination value tan $\theta$ of the carrier 10 needs to be equal to or smaller than $0.25 \times 10^{-3}$. That is, in the double-sided wafer polishing process according to the present embodiment, a carrier whose inclination value exceeds $0.25 \times 10^{-3}$ is not used. To increase the reliability of the inclination value of the carrier 10, it is preferable to use an average value of inclination values measured at a plurality of positions around the wafer loading hole.

Figure 4:
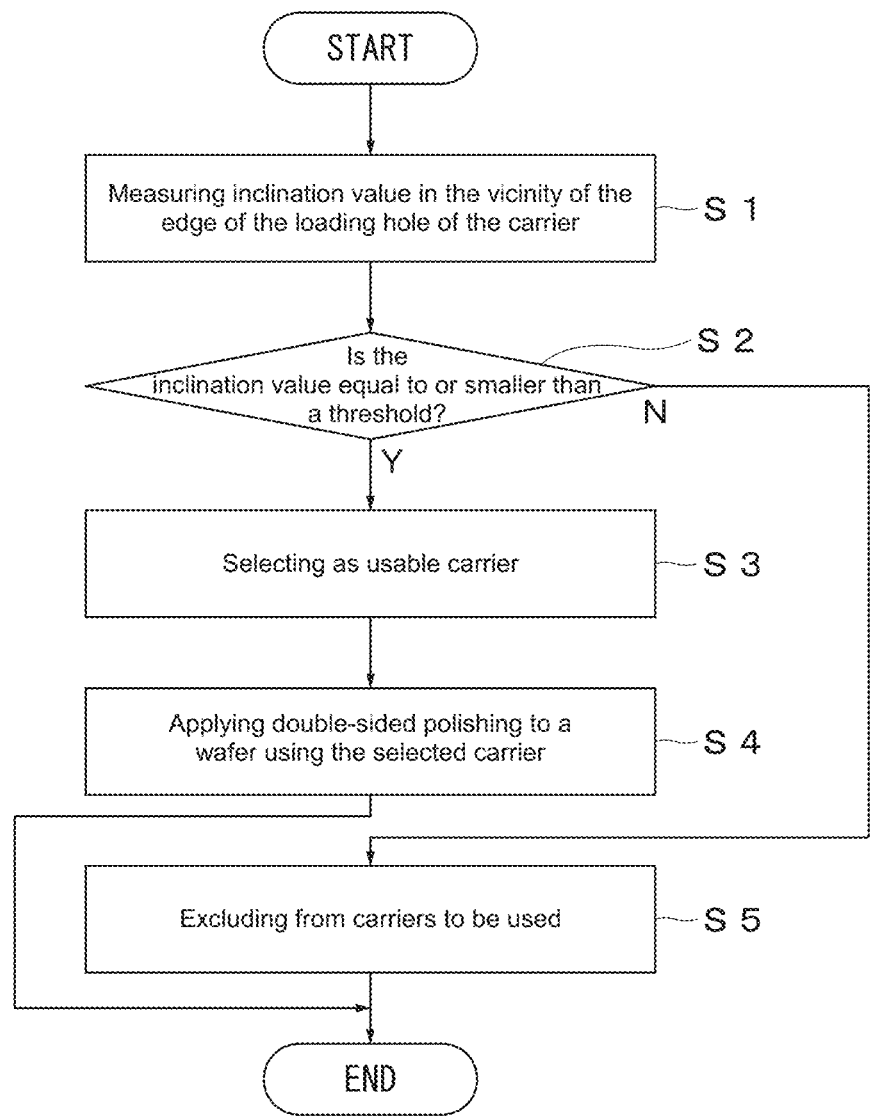
FIG. 4 is a flowchart for explaining the double-sided polishing method of the wafer including a carrier selecting process.

FIG. 4 is a flowchart for explaining the double-sided polishing method of the wafer including a carrier selecting process.

As illustrated in FIG. 4, the double-sided polishing method of the wafer according to the present embodiment includes a step (S1) of previously measuring the inclination value of the carrier 10 to be used in the double-sided polishing apparatus, a step (Yes in S2, S3) of selecting a carrier whose inclination value is equal to or smaller than a threshold ($0.25 \times 10^{-3}$) as a carrier usable in the double-sided polishing process, and a step (S4) of applying the double-sided polishing to the wafer using the selected carrier. A carrier whose inclination value exceeds the threshold is excluded from carriers to be used (No in S2, S5).

As described above, by limiting the inclination value of the carrier 10 to be used in the double-sided polishing of the wafer to $0.25 \times 10^{-3}$ or smaller, the wafer can be improved in terms of outer peripheral shape distribution after the polishing.

Figure 5A:
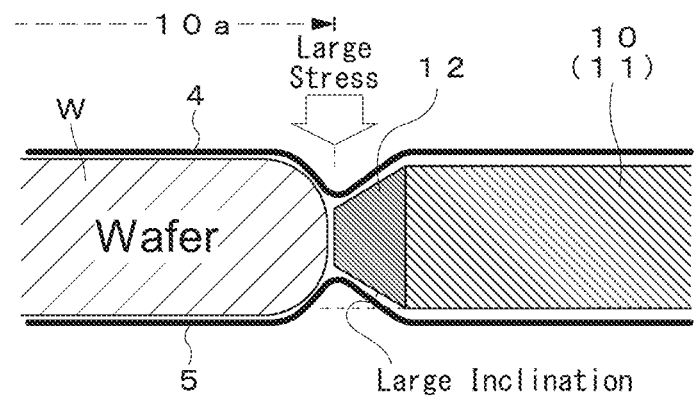
Figure 5B:
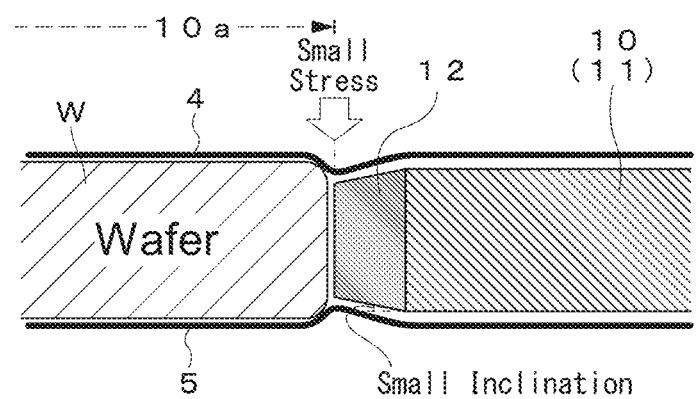

FIGS. 5A and 5B are schematic diagrams for explaining the relationship between the inclined shape of the main surface of the carrier 10 in the vicinity of the edge of the wafer loading hole 10a and the edge shape of the wafer after the polishing. FIG. 5A illustrates the inclined surface according to a conventional technique, and FIG. 5B illustrates the inclined surface according to the present invention.

In the double-sided polishing, the wafer W is sandwiched between the upper and lower platens 2 and 3 and is polished while being applied with a pressure with polishing cloths 4 and 5 each having a thickness of about 1 mm interposed between the upper platen 2 and the wafer W and between the lower platen 3 and the wafer W, respectively, so that when the inclination value of the carrier 10 is large as illustrated in FIG. 5A, a large recess is formed between the carrier 10 and the wafer W, and the polishing cloths 4 and 5 are sunk into the recess, with the result that the polishing amount of the edge of the wafer W is increased. That is, stress (polishing pressure) applied to the edge of the wafer W is increased, so that the edge roll-off of the wafer W after the polishing becomes large.

However, as illustrated in FIG. 5B, when the inclination value of the carrier 10 is small, the recess formed between the carrier 10 and the wafer W becomes small, with the result that the polishing amount of the edge of the wafer W is reduced. That is, stress (polishing pressure) applied to the edge of the wafer W is reduced, so that the edge roll-off of the wafer W after the polishing becomes small.

When the polishing process advances to reduce the thickness of the wafer W, a difference (gap) in thickness between the wafer W and the carrier 10 becomes small; however, when the thickness around the wafer loading hole is small, the outer peripheral shape of the wafer W is subjected to the edge roll-off even if the polishing advances. However, in the present embodiment, the outer peripheral shape of the wafer W after the polishing can be improved by the following way: measuring the thickness of the carrier 10 around the wafer loading hole; calculating the inclination value of the carrier 10 around the wafer loading hole based on a result of the measurement; and managing the inclination value of the carrier 10 to be used to a value equal to or smaller than a threshold.

The dominant factor of the edge roll-off of the wafer W is a thickness profile around the wafer loading hole and, even if the thickness of the carrier varies, a good result is obtained when the inclination value around the wafer loading hole is small. However, influence of the inclination value around the wafer loading hole is large, so that if the wafer is polished to a thickness equivalent to the thickness of the carrier to cause the thickness of the wafer after the polishing to vary relative to the thickness of the carrier, the edge roll-off of the wafer cannot be prevented.

As described above, in the double-sided polishing method of a wafer according to the present embodiment that compresses and holds the wafer W set in the wafer loading hole 10a of the carrier 10 along with the carrier 10 between the upper and lower platens 2 and 3 and applies the double-sided polishing to the wafer W by rotating the upper and lower platens 2 and 3 while supplying slurry to the wafer W, only a carrier whose inclination value within a certain range from the inner peripheral edge of the wafer loading hole 10a of the carrier 10 is equal to or smaller than $0.25 \times 10^{-3}$ is used, so that the roll-off shape of the wafer outer peripheral portion can be suppressed, allowing a variation in the flatness of the wafer outer peripheral portion to be reduced.

While the present invention has been described based on the preferred embodiment, the present invention is not limited to the above embodiments, and various modifications may be made within the scope of the present invention. Accordingly, all such modifications are included in the present invention.

While, for example, the carrier 10 is constituted of the metal carrier body 11 and the resin inserter 12 in the above embodiment, the entire carrier may be made of resin, that is, the carrier body 11 and the resin inserter 12 may be integrated with each other. Alternatively, the entire carrier 10 may be made of metal.

Further, while one carrier 10 has one wafer loading hole 10a and holds one wafer W in the above embodiment, one carrier 10 may have a plurality of wafer loading holes 10a. In this case, the inclination value of the main surface in the vicinity of the edge of each of the plurality of wafer loading holes 10a needs to be equal to or smaller than $0.25 \times 10^{-3}$, and a variation in thickness among the plurality of carriers is preferably ±4 µm or smaller.

Further, the configuration of the double-sided polishing apparatus 1 in the present embodiment is merely illustrative, and any one of various types can be employed. Further, the wafer to be polished is not limited to a silicon wafer, and wafers of various types can be used as the wafer to be polished.

EXAMPLES

A large number of carrier samples with varying carrier inclination values were used to evaluate the flatness of the edge of a silicon wafer having a diameter of 300 mm after the double-sided polishing. In this evaluation test, 150 carriers were prepared, and then line scan measurement was performed for the prepared 150 carriers using a laser displacement meter, and the inclination value of the main surface of each carrier in the vicinity of the wafer loading hole was calculated.

Figure 6A:
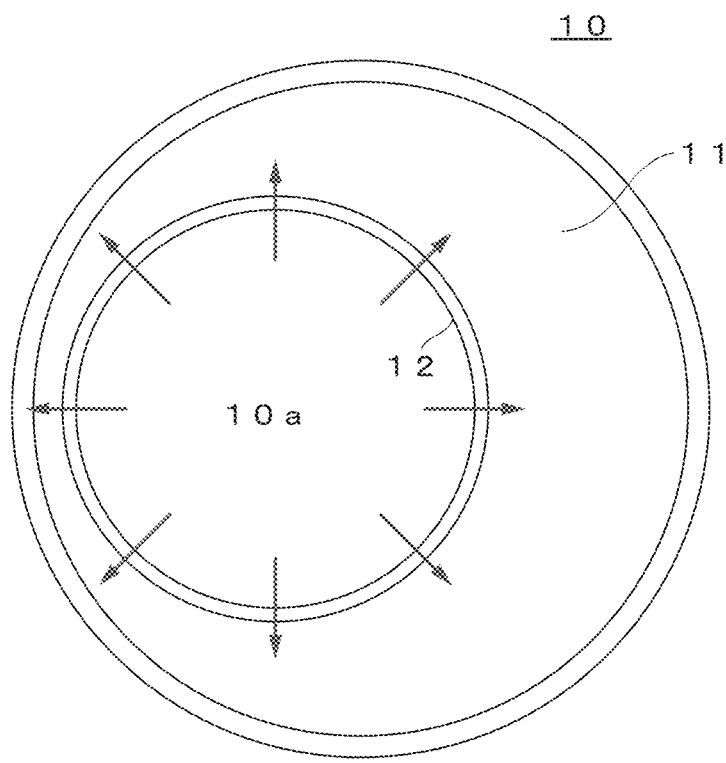
Figure 6B:
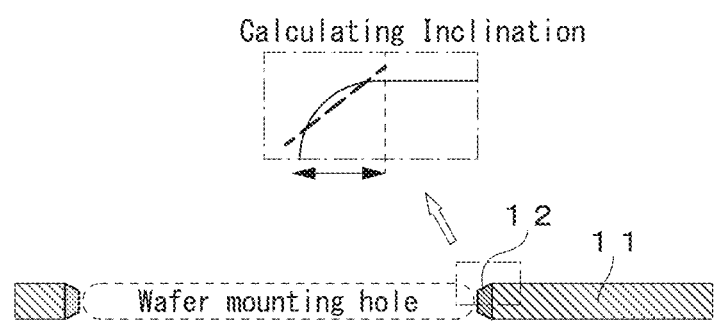

FIGS. 6A and 6B are views for explaining a method of measuring the carrier inclination value. FIG. 6A is a plan view for explaining line scan measurement positions of the carrier, and FIG. 6B is a cross-sectional side view for explaining the image of a carrier to be measured and an inclination calculation position of the carrier.

As illustrated in FIGS. 6A and 6B, eight line scan measurement positions were set around the wafer loading hole. Then, the inclination values were calculated at respective measurement positions, and the average value thereof was used as the carrier inclination value. A measurement length x used in the calculation of the inclination value at each measurement position of the carrier was set to 2 mm which is the width of an area where the resin inserter exists.

The line scan measurement was performed as illustrated from the inside of the wafer loading hole toward the outside of the carrier, and the inclination of the regression line (regression coefficient) when the measurement length and carrier thickness were set to x and y, respectively, was calculated.

An inclination a of the regression line is obtained by correlation coefficient×(standard deviation of y/standard deviation of x), and assuming that the average values of x and y are $m_x$ and $m_y$, respectively, the following expression is obtained.

$$a = \frac{\Sigma(x-m_x)(y-m_y)}{\Sigma(x-m_x)^2} \quad \text{[Equation 1]}$$

The carriers whose inclination values had been measured were used to apply the double-sided polishing to the silicon wafer. The double-sided polishing apparatus used in the evaluation test is the apparatus of FIG. 2 in which five carriers can be set at a time, so that the polishing process was performed with five carries as one set. Polishing conditions included: using a urethane foam pad having a thickness of 1.0 mm; using alkaline slurry containing colloidal silica as abrasive grain; setting a platen rotation speed to 20 rpm to 30 rpm; and setting a processing surface pressure to 300 g/cm². The thickness of the silicon wafer before the polishing was set to 790 µm, the thickness of the carrier was set to 778 µm, and the target thickness of the silicon wafer after the polishing was set to 778 µm to 782 µm. A laser displacement meter was used for measurement of the thickness of the silicon wafer.

Then, ESFQD and ESFQR of the wafer after the double-sided polishing were measured, and influence that the carrier inclination value has on the outer peripheral shape of the wafer was confirmed. The ESFQD (Edge Site flatness Front reference least sQuare Deviation) and ESFQR (Edge Site flatness Front reference least sQuare Range) are each an evaluation index for flatness (site flatness) focusing on the edge of the wafer where the flatness is easily degraded and each indicate the magnitude of the edge roll-off. The flatness of the edge of the wafer is calculated for each unit area (site) obtained by evenly dividing in the peripheral direction the ring-shaped outer peripheral area set in a range (sector length: 30 mm) of, e.g., 2 mm to 32 mm from the outermost periphery of the wafer. A flatness measuring instrument (WaferSight2 manufactured by KLA-Tencor Corporation) was used for the wafer flatness measurement. In the measurement, the measurement range was set to 296 mm (excluding a 2 mm section from the outermost periphery). Further, for the edge site measurement, the number of sectors (number of sites) was set to 72, and the sector length was set to 30 mm.

Figure 7:
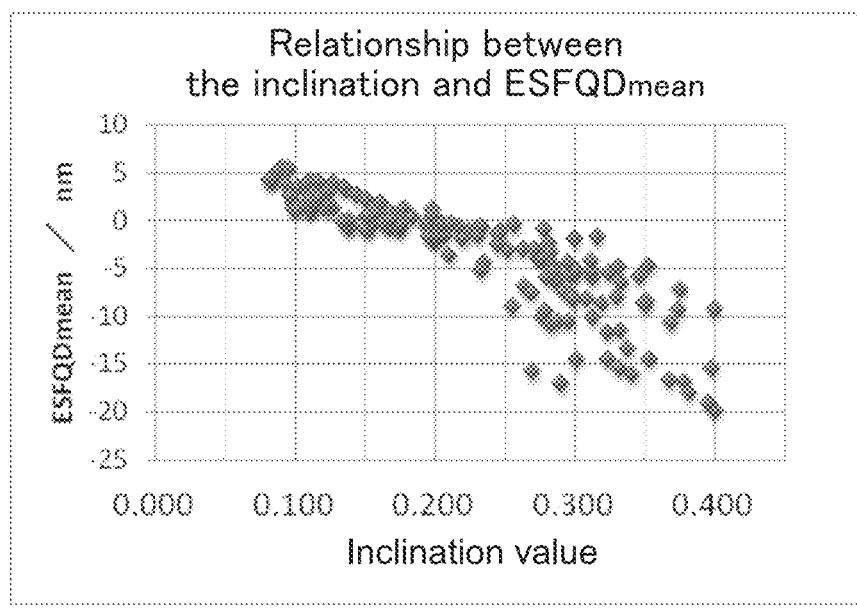
FIG. 7 is a scatter diagram illustrating the relationship between the carrier inclination value and ESFQDmean.
Figure 8:
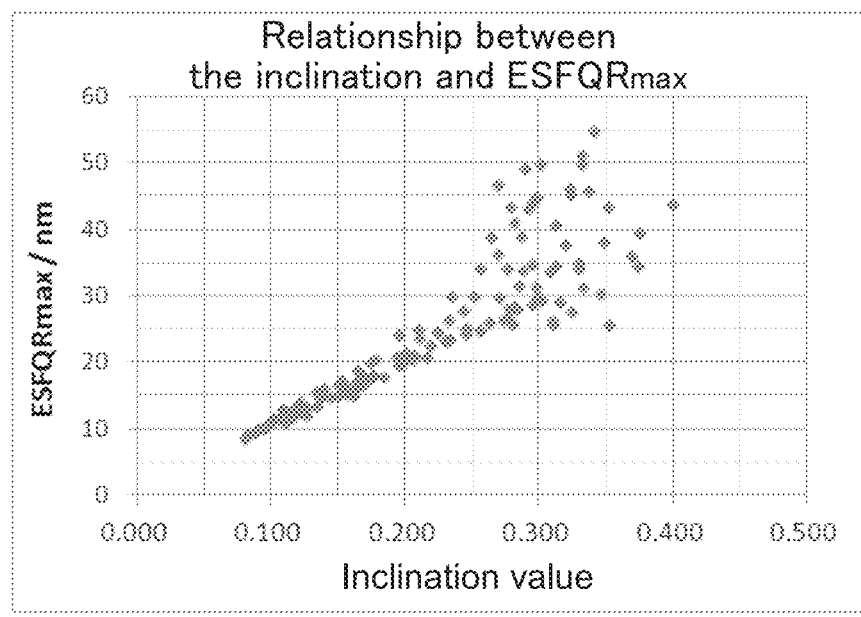
FIG. 8 is a scatter diagram illustrating the relationship between the carrier inclination value and ESFQRmax.

FIG. 7 is a scatter diagram illustrating the relationship between the carrier inclination value and ESFQDmean, and FIG. 8 is a scatter diagram illustrating the relationship between the carrier inclination value and ESFQRmax.

The ESFQDmean is the mean value of the ESFQDs over all sites, and the ESFQD refers to a deviation having a larger absolute value between a maximum deviation ($\alpha$) and a minimum deviation ($-\beta$) from a reference surface (Site Best Fit Surface) obtained by least-square method from a thickness distribution in the site. For example, when $\alpha$ is larger than $\beta$, the ESFQD is $\alpha$, while when $\alpha$ is smaller than $\beta$, the ESFQD is $-\beta$. The ESFQD is an index that can have positive and negative values, and the larger the ESFQD on the negative side is, the larger the edge roll-off of the wafer becomes.

The ESFQRmax is the maximum value among the ESFQRs over all sites, and the ESFQR refers to a difference ($\alpha-(-\beta)$) between the maximum deviation ($\alpha$) and the minimum deviation ($\beta$) from the Site Best Fit Surface. The larger the ESFQR is, the larger the edge roll-off of the wafer becomes, while as the ESFQD approaches 0, the outer peripheral flatness is improved.

As illustrated in FIGS. 7 and 8, the larger the carrier inclination value, the larger the ESFQDmean becomes on the negative side. In particular, when the carrier inclination value becomes equal to or larger than $0.25\times10^{-3}$, a variation in the distribution of the ESFQDmean becomes larger and a variation in the distribution of the ESFQRmax becomes larger. Conversely, when the carrier inclination value becomes small, the ESFQDmean values tend to move from the negative side to the positive side, with the result that the edge roll-off of the wafer becomes small, and the ESFQRmax is improved. From the above, it can be seen that in order to improve the ESFQR and ensure stabilized production, the inclination value is desirably equal to or smaller than $0.25\times10^{-3}$. Further, the graph of FIG. 8 reveals that when the target value of the ESFQRmax is set equal to or smaller than 25 nm, more improved outer peripheral flatness can be maintained by using a carrier having an inclination value equal to or smaller than $0.2\times10^{-3}$.

Then, influence that "Gap" and carrier inclination value had on the wafer flatness was evaluated, the "Gap" being a difference (wafer thickness after polishing−carrier thickness) between the mean value (mean thickness) at calculation positions for the thickness of the carrier in the vicinity of the edge of the wafer loading hole (around carrier hole) and the wafer thickness after polishing.

FIG. 9 is a table showing the relationship between the Gap and ESFQDmean and ESFQRmax of the wafer after polishing for each inclination value of the carrier in the vicinity of the edge of the wafer loading hole (carrier hole).

As shown in FIG. 9, this evaluation test was performed in the Gap range of 0 µm to +4 µm, and in this range, it was possible to make the ESFQRmax of any wafer equal to or smaller than 25 µm by setting the carrier inclination value equal to or smaller than $0.25\times10^{-3}$. Conversely, when the inclination value was equal to or larger than $0.3\times10^{-3}$, it was impossible to make the ESFQRmax equal to or smaller than 25 µm. At this time, when the thickness of an area (a large part of the carrier) where generally no resin inserter exists was managed/used in a range of ±4 mm in the thickness of the inclination value calculation position (in the vicinity of the edge), influence on the flatness was not confirmed. This reveals that the thickness profile in the vicinity of the edge of the wafer loading hole that is the inclination value calculation position this time determines the shape of the wafer edge roll-off and thus that management of the shape in the vicinity of the edge of the wafer loading hole is important.

Figure 10:
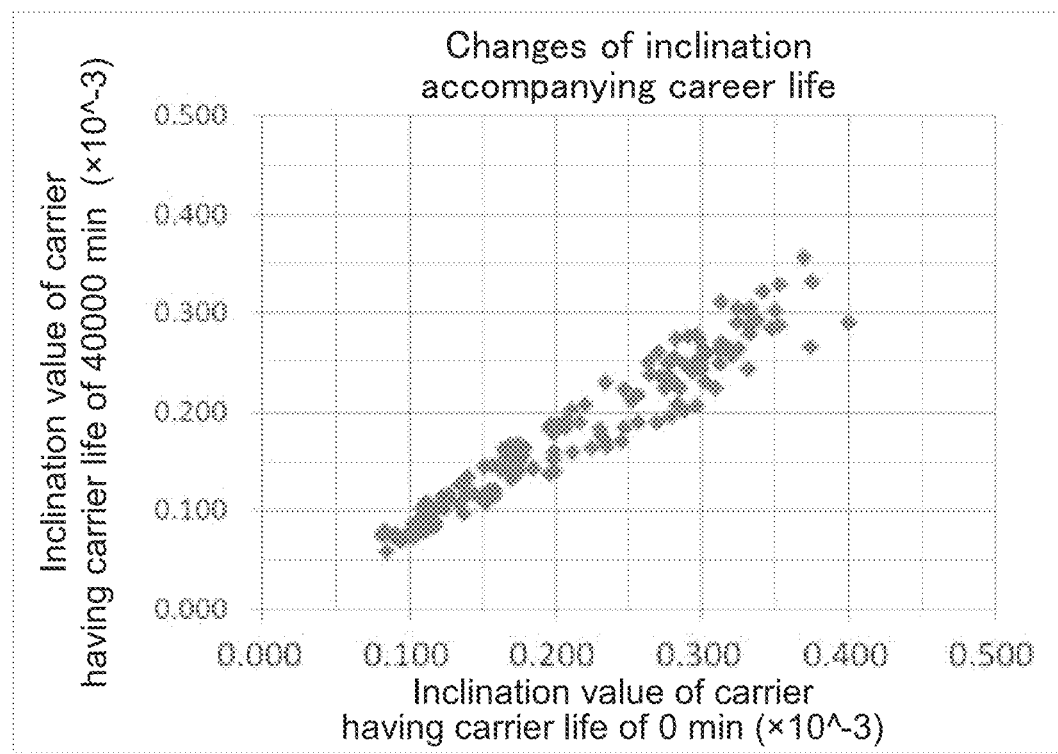
FIG. 10 is a scatter diagram illustrating the relationship between the inclination value of a carrier having a carrier life of 0 min (before use) and the inclination value of a carrier having a carrier life of 40000 min (after use).

FIG. 10 is a scatter diagram illustrating the relationship between the inclination value of a carrier having a carrier life of 0 min (before use) and the inclination value of a carrier having a carrier life of 40000 min (after use).

As illustrated in FIG. 10, it was confirmed that the inclination value of the carrier after use was reduced by 0% to about 30% relative to the carrier before use. This is because the inclination value is reduced due to reduction in thickness of the entire carrier with the advance of the carrier life. This reveals that by limiting the inclination value at initial loading, it is possible to continue the processing of wafers with a high degree of flatness.

REFERENCE SIGNS LIST 1 double-sided polishing apparatus
2 upper platen
3 lower platen
4, 5 polishing cloths
6 sun gear
7 internal gear
10 carrier
10a wafer loading hole
10b outer peripheral teeth
11 carrier body
11a opening of the carrier body
11b outer peripheral teeth of the carrier body
12 resin inserter
12a inner opening of the resin inserter
W wafer

What is claimed is:
1. A double-sided polishing method of a wafer in which, the wafer, which has been set in a wafer loading hole of a carrier, is compressed and held along with the carrier with an upper platen and a lower platen and the upper platen and the lower platen are rotated while supplying slurry to the wafer, the method comprising:

previously measuring an inclination value of a main surface of each of a plurality of carriers in the vicinity of the edge of the wafer loading hole;

selecting, from among the plurality of carriers, one or more carriers for which the inclination value is equal to or smaller than a threshold based on the measurement results of the inclination value of the main surface of each of the plurality of carriers; and applying the double-sided polishing to the wafer using one or more of the selected carriers.

2. The double-sided polishing method of a wafer as claimed in claim 1, wherein the threshold is set to $0.25 \times 10^{-3}$.

3. The double-sided polishing method of a wafer as claimed in claim 1, wherein the measurement range of the inclination value is set in a range between the inner peripheral edge of the wafer loading hole of the carrier and a 2 mm inward position therefrom.

4. The double-sided polishing method of a wafer as claimed in claim 1, wherein the inclination value of the main surface of each carrier in the vicinity of the edge of the wafer loading hole is the inclination value at one position of the inner peripheral edge of the wafer loading hole or mean value of the inclination values at a plurality of positions of the inner peripheral edge of the wafer loading hole.

5. The double-sided polishing method of a wafer as claimed in claim 1, wherein the inclination value of the main surface of each carrier in the vicinity of the edge of the wafer loading hole is an inclination of a regression line derived from the thickness distribution of the carrier within a certain range from the inner peripheral edge of the wafer loading hole.

6. The double-sided polishing method of a wafer as claimed in claim 1, wherein each of the plurality of the carriers is constituted of a combination of a metal carrier body having a circular opening and a ring-shaped resin inserter provided along the inner periphery of the opening of the carrier body, and the width of the resin inserter is equal to or larger than 2 mm.

7. The double-sided polishing method of a wafer as claimed in claim 1, wherein a plurality of carriers are used to apply double-sided polishing to a plurality of wafers at a time, the respective inclination values of the main surfaces of the plurality of respective carriers in the vicinity of the edge of a wafer loading hole are equal to or smaller than the threshold, and a variation in thickness among the plurality of carriers falls within ±4 µm.

\* \* \* \* \*